(12) United States Patent
Zou et al.

(10) Patent No.: US 11,460,537 B2
(45) Date of Patent: Oct. 4, 2022

(54) MICROSTRIP MIXER AND MICROWAVE-DOPPLER DETECTING MODULE

(71) Applicant: Gaodi Zou, Shenzhen (CN)

(72) Inventors: Gaodi Zou, Shenzhen (CN); Xin Zou, Shenzhen (CN)

(73) Assignee: Gaodi Zou, Shenzhen (CN)

( * ) Notice: Subject to any disclaimer, the term of this patent is extended or adjusted under 35 U.S.C. 154(b) by 231 days.

(21) Appl. No.: 16/992,107

(22) Filed: Aug. 13, 2020

(65) Prior Publication Data

US 2021/0181299 A1 Jun. 17, 2021

(30) Foreign Application Priority Data

Dec. 13, 2019 (CN) .......................... 201911278690.6

(51) Int. Cl.
| | |
|---|---|
| *G01S 7/03* | (2006.01) |
| *G01S 13/53* | (2006.01) |
| *G01S 13/56* | (2006.01) |
| *G01S 13/536* | (2006.01) |
| *H01P 3/08* | (2006.01) |
| *H03D 7/02* | (2006.01) |

(52) U.S. Cl.
CPC ............ *G01S 7/032* (2013.01); *G01S 13/536* (2013.01); *G01S 13/56* (2013.01); *H01P 3/081* (2013.01); *H03D 7/02* (2013.01)

(58) Field of Classification Search
CPC ........ G01S 7/032; G01S 13/536; G01S 13/56; H01P 3/081; H03D 7/02
See application file for complete search history.

(56) References Cited

U.S. PATENT DOCUMENTS 4,008,438 A * 2/1977 Shinkawa ................ H04B 1/26
363/157
4,603,437 A * 7/1986 Dydyk ................. H03D 9/0633
455/330

* cited by examiner

*Primary Examiner* — Erin F Heard
*Assistant Examiner* — Helena H Seraydaryan
(74) *Attorney, Agent, or Firm* — Raymond Y. Chan; David and Raymond Patent Firm

(57) ABSTRACT

A microstrip mixer of a microwave-doppler detecting module has a shared port, a local oscillator signal input port and a mixing output port and includes two mixer tubes. The local oscillator signal input port is electrically connected with the shared port and is electrically connected with an end of one of the mixer tubes through the shared port. The local oscillator signal input port is also electrically connected with the mixing output port and is electrically connected with an end of the other mixer tube through the mixing output port. The other ends of the two mixer tubes are respectively grounded. Accordingly, the microstrip mixer is configured to have an open structure having three ports, which is more flexible and enhances the applicability thereof while reducing the size of the microwave-doppler detecting module utilizing the microstrip mixer.

32 Claims, 4 Drawing Sheets

MICROSTRIP MIXER AND MICROWAVE-DOPPLER DETECTING MODULE

CROSS REFERENCE OF RELATED APPLICATION

This is a non-provisional application that claims the benefit of priority under 35 U.S.C. § 119 to Chinese applications, application number 201911278690.6, filed Dec. 13, 2019.

BACKGROUND OF THE PRESENT INVENTION

Field of Invention

The present invention relates to the field of microwave-doppler sounding and detecting, and more particularly to a microstrip mixer of a microwave-doppler detecting module with an integral structure for receiving and dispatching, and a microwave-doppler detecting module having the microstrip mixer.

Description of Related Arts

With development of IOT (Internet of things), artificial intelligence (AI), intelligent home, and intelligent security have higher and higher demands in the accuracy of the detection of the environment, especially for the existence, movements, and motion characteristics of fine motions of human. Here, microwave detection technology based on Doppler Effect is utilized as a critical key to connect and relate among humans and objects and has a unique advantage among the behavior detection and existence detection technologies. That is, it is able to detect moving object, such as a person's motion characteristics, movement characteristics, fine motion characteristics, and even heartbeat and breath characteristics, without invading his/her privacy. Therefore, such technology has a wide-ranging application prospect.

Conventional microwave-doppler detecting modules mostly utilize integral structure for receiving and dispatching due to the considerations in cost and size. When it has a mixer be fed by a local oscillator signal to emit a sounding wave beam corresponding to the local oscillation frequency and to receive an echo of the sounding wave beam, the echo is received to form a feedback signal. Then the mixer is utilized to receive the feedback signal and to output an intermediate-frequency signal corresponding to the frequency difference between the local oscillator signal and the feedback signal. Accordingly, based on Doppler Effect, the intermediate-frequency signal is corresponding to the movement of the corresponding object that reflects the sounding wave beam and forms the echo. Here, based on the corresponding demand of a mixer for the microwave-doppler module with an integral structure for receiving and dispatching, in addition to the advantages of high sensitivity and low noise of the balanced mixer, the conventional microwave-doppler devices with integral structure for receiving and dispatching mainly utilize balanced mixer. Specifically, referring to FIG. 1, an equivalent circuitry of a conventional balanced mixer is illustrated. The balanced mixer includes an electric bridge 10P, a high frequency filtering circuit 20P, two mixer tube 30P, and an intermediate frequency output line 40, wherein the electric bridge 10P has a local oscillator signal input port 11P, a feedback signal input port 12P, and two mixing output ports 13P, 14P, wherein an end of the two mixer tubes 30P are respectively electrically connected with the two mixing output port 13P and 14P of the electric bridge 10P. The high frequency filtering circuit 20P is connected between the two mixer tubes 30P by the other end of the two mixer tubes 30P. The intermediate frequency output line 40P is drawn out and extended from the high frequency filtering circuit 20P between the two mixer tubes 30P. Corresponding to the equivalent circuitry as illustrated in FIG. 1, referring to FIG. 2, a microstrip balanced mixer utilizing a 3 dB electric bridge with two branches is illustrated, wherein the electric bridge 10P is configured to be a microstrip frame 10P', wherein the microstrip frame 10P' is made into a rheostat form in order to have asymmetric input and output, so as to achieve the two functions of electric bridge and impedance change at the same time through the microstrip frame 10P'. The high frequency filtering circuit 20P is provided at the low impedance circuit between the other end of the two mixer tubes 30P so as to form a high frequency short circuit to have the high frequency of the end of the two mixer tubes 30P short to the ground, which makes the powers of the local oscillator signal and the feedback signal input from the local oscillator signal input port 11P and the feedback signal input port 12P being both loaded onto the two mixer tubes 30P rather than leaking to the intermediate frequency output line 40P. In particular, based on the circuitry of the balanced mixer, the circuit of the microstrip balancer may have various alternative modes, which main differences are regarding the implementations of the electric bridge 10P, including the structural alternatives of the microstrip frame 10P'. Specifically, referring to FIGS. 3-10, various implementations of the electric bridge 10P are illustrated, wherein FIGS. 3-8 respectively illustrate common conventional electric bridge of two branches, electric bridge of three branches, rheostat electric bridge, ringlike rheostat electric bridge of two branches, ringlike electric bridge, and broadband ringlike electric bridge. Here, specific implementations of the electric bridge 10P are flexible based on the various alternatives and combinations of the different implementations illustrated in FIGS. 3-8. On the basis of the various alternatives and combinations of the different implementations of the electric bridge 10P illustrated in FIGS. 3-8, correspondingly, FIGS. 9 and 10 illustrate a general microstrip balanced mixer utilized by a conventional microwave-doppler detecting module. Although specific implementations of the electric bridge 10P are flexible, nevertheless, the structure corresponding to the microstrip frame 10P' remains to be a frame shaped structure with four ports. Here, the microstrip lines of the microstrip frame 10P' usually require the length of a wavelength (corresponding to the wavelength of the local oscillator signal frequency) to be enough for conducting asymmetric input and output. Besides, the corresponding positions of the local oscillator signal input port 11P, the feedback signal input port 12P, and the two mixing output ports 13P and 14P are restricted based on the structure of the microstrip frame 10P', which not only makes it difficult to further reduce the occupied volume of the microstrip balanced mixer, but also limits the corresponding circuit of the circuit board having the microstrip balanced mixer disposed thereon. That is, the size of the circuit board can hardly be reduced and the design of the corresponding circuit on the circuit board must consider the positions of the ports of the electric bridge 10P, that makes the designing harder.

In other words, even though the specific implementations of the electric bridge 10P of the microstrip balanced mixer may be flexible and varied, the size of the electric bridge 10P based on a structure of a frame shape can hardly be reduced and the port positions of the electric bridge 10P are limited. The flexible implementations of the electric bridge 10P cannot provide any advantage for simplifying the design of the circuit of the microstrip balanced mixer. Moreover, the design of the circuit with the microstrip balanced mixer must be coordinated with the port positions and size of the electric bridge 10. As a result, the area size of the circuit board with a conventional microstrip balanced mixer can hardly be reduced for achieving miniaturization and modularization purposes and the difficulty of designing the circuit is high. Accordingly, further reducing the size of the microwave-doppler detecting module that utilizes the microstrip balanced mixer costs higher in circuit designing.

SUMMARY OF THE PRESENT INVENTION

An object of the present invention is to provide a microstrip mixer and a microwave-doppler detecting module, wherein the microstrip mixer utilizes an open structure having three ports, which makes the microstrip structure design of the microstrip mixer more flexible and reduces the limitation to the port positions of the microstrip mixer, such that the microstrip mixer not only has a flexible microstrip structure design, but also is capable of being designed in being adapted to corresponding circuit structures, which enhances the applicability of the microstrip mixer.

Another object of the present invention is to provide a microstrip mixer and a microwave-doppler detecting module, wherein the microstrip mixer has a flexible microstrip structure design, which is beneficial for reducing the size of the microstrip mixer.

Another object of the present invention is to provide a microstrip mixer and a microwave-doppler detecting module, wherein the size of the microstrip mixer can be reduced based on the flexible microstrip structure design thereof, such that the size of the circuit board that loads the microstrip mixer can be reduced as well, which helps to reduce the size of the microwave-doppler detecting module that utilizes the microstrip mixer.

Another object of the present invention is to provide a microstrip mixer and a microwave-doppler detecting module, wherein the microstrip mixer has a shared port that is adapted for feedback signal input and mixing output and a local oscillator signal input port that is adapted for local oscillator signal input, wherein the shared port is electrically connected with the local oscillator signal input port, wherein the local oscillator signal is output through feeding the microwave-doppler detecting module through the shared port and the feedback signal is received by the microstrip mixer through the shared port, such that the microstrip mixer is suitable for mixing output for the microwave-doppler detecting module with an integral structure for receiving and dispatching.

Another object of the present invention is to provide a microstrip mixer and a microwave-doppler detecting module, wherein the microstrip mixer includes a microstrip mixing line and two mixer tubes, wherein based on the open structure design of the three ports of the microstrip mixer, the microstrip mixing line can allow the mixer tubes to phasingly mixing output in the length range of a wavelength, wherein the wavelength here is corresponding to the wavelength of the local oscillator signal frequency, which facilitates to decrease the length of the microstrip mixing line and reduce the size of the microstrip mixer.

Another object of the present invention is to provide a microstrip mixer and a microwave-doppler detecting module, wherein the microstrip mixing line further comprises a mixing output port, wherein it has a phase difference of 180 degrees to the local oscillator signals output by the shared port and the mixing output port. In other words, the phase difference between the mixing output port and the shared port is 180 degrees, so as to allow the microstrip mixer to output an intermediate-frequency signal that is corresponding to the frequency difference between the local oscillator signal and the feedback signal in a maximum amplitude, which is beneficial for enhancing the sensitivity of the microwave-doppler detecting module.

Another object of the present invention is to provide a microstrip mixer and a microwave-doppler detecting module, wherein the local oscillator signal input port is disposed between the shared port and the mixing output port on the microstrip mixing line, wherein the mixing output port and the shared port have a phase difference of 180 degrees therebetween, such that there is an electrical length of almost 180 degrees between the shared port and the mixing output port from the shared port through the local oscillator signal input port to the mixing output port, which allows the microstrip mixing line to be configured to achieve a phase difference of 180 degrees between the mixing output port and the shared port within the length range of a wavelength, which is beneficial for reducing the length of the microstrip mixing line and the size of the microstrip mixer.

Another object of the present invention is to provide a microstrip mixer and a microwave-doppler detecting module, wherein the phase difference between the local oscillator signal input port and the shared port is 90 degrees and the phase difference between the local oscillator signal input port and the mixing output port is also 90 degrees, such that it allows the two mixer tubes to be respectively arranged at the mixing output port and the shared port in opposite direction (i.e. when the positive electrode of one of the mixer tubes is connected with the mixing output port, the negative electrode of the other of the mixer tubes is connected with the shared port), so as to create a phase difference of 180 degrees between the mixing output port and the shared port.

Another object of the present invention is to provide a microstrip mixer and a microwave-doppler detecting module, wherein the microstrip mixing line includes a first microstrip arm formed between the shared port and the local oscillator signal input port and a second microstrip arm formed between the local oscillator signal input port and the mixing output port, wherein the arm length parameters $L1$ and $L2$ of the first microstrip arm and the second microstrip arm are configured to satisfy that $\lambda/16 \leq L1 = L2 \leq \lambda/2$, wherein $\lambda$ is corresponding to the wavelength parameter of the local oscillator signal frequency, which facilitates to create a phase difference of 90 degrees between the local oscillator signal input port and the shared port and a phase difference of 90 degrees between the local oscillator signal input port and the mixing output port.

Another object of the present invention is to provide a microstrip mixer and a microwave-doppler detecting module, wherein the impedance parameters $Z1$ and $Z2$ of the first microstrip arm and the second microstrip arm are configured to satisfy that $Z2 = k \cdot Z1$, wherein k preferably satisfies that $2 \leq k \leq 4$, such that the first microstrip arm and the second microstrip arm can also satisfy $\lambda/16 \leq L1 = L2 \leq \lambda/2$ and $Z2 = k \cdot Z1$ at the same time, and it utilizes the impedance relations between the first microstrip arm and the second microstrip arm that satisfies $Z2 = k \cdot Z1$ to reasonably distribute the oscillation voltage power, which facilitates the impedance matching of the microwave-doppler detecting module.

Another object of the present invention is to provide a microstrip mixer and a microwave-doppler detecting module, wherein first ends of the two mixer tubes are respectively electrically connected with the shared port and the mixing output port and second ends of the two mixer tubes are grounded, such that the high frequency local oscillator signal and feedback signal respectively outputted from the shared port and the mixing output port to the mixer tubes correspondingly can be conducted to the ground, which lowers the interference to the intermediate-frequency signal output by the microstrip mixer and increases the sensitivity of the microstrip mixer.

Another object of the present invention is to provide a microstrip mixer and a microwave-doppler detecting module, wherein the shared port is electrically connected with the local oscillator signal input port and an end of one of the mixer tubes, wherein local oscillator signal input port is electrically connected with the mixing output port and is electrically connected with an end of the other of the mixer tubes through the mixing output port, wherein the other ends of the two mixer tubes are respectively grounded, so as to form the microstrip mixer with an open structure having three ports.

Another object of the present invention is to provide a microstrip mixer and a microwave-doppler detecting module, wherein the microstrip mixer further includes a grounding bonding pad, wherein the grounding bonding pad is grounded, so as to be adapted for creating a condition that first ends of the two mixer tubes are respectively electrically connected with the shared port and the mixing output port, while second ends of the two mixer tubes are grounded by means of having the two mixer tubes respectively be connected between the grounding bonding pad and the mixing output port and between the grounding bonding pad and the shared port, that facilitates to simplify the circuit structure of the microstrip mixer.

Another object of the present invention is to provide a microstrip mixer and a microwave-doppler detecting module, wherein the grounding bonding pad is grounded through a plated hole extended from the grounding bonding pad, which is beneficial for simplifying the circuit structure of the microstrip mixer as well as for enhancing the consistency of the circuit structure of the microstrip mixer.

Another object of the present invention is to provide a microstrip mixer and a microwave-doppler detecting module, wherein the microstrip mixing line includes a feedback signal input arm integrally extended from the shared port and a local oscillator signal input arm integrally extended from the local oscillator signal input port, so as to utilize the structure and design of the local oscillator signal input arm and the feedback signal input arm to allow the microstrip mixer to be adapted by various circuit structures on the circuit board, which further enhances the applicability of the microstrip mixer.

Another object of the present invention is to provide a microstrip mixer and a microwave-doppler detecting module, wherein the microwave-doppler detecting module includes an oscillation circuit module, a reference ground and a radiation source, wherein the oscillation circuit module is configured to be able to output local oscillator signal when powered, wherein the oscillation circuit module is electrically coupled with the local oscillator signal input port of the microstrip mixer through the local oscillator signal input arm, wherein the radiation source is electrically coupled with the shared port of the microstrip mixer through the feedback signal input arm, wherein the reference ground is grounded, such that the oscillation circuit module can be electrically coupled with the radiation source through the local oscillator signal input arm, the first microstrip arm, and the feedback signal input arm, and feed the radiation source.

Another object of the present invention is to provide a microstrip mixer and a microwave-doppler detecting module, wherein the microstrip mixer with an open structure having three ports has a simple and flexible microstrip structure, allowing it to be adapted for being designed to fit corresponding circuit structure and to be able to output the intermediate-frequency signal corresponding to the frequency difference between the local oscillator signal and the feedback signal in a maximum amplitude, which is therefore very cost-effective.

According to an aspect of the present invention, the present invention provides a microstrip mixer, which includes:

two mixer tubes each having a first end being grounded; and a microstrip mixing line, comprising a first microstrip arm and a second microstrip arm integrally extended from the first microstrip arm, and having a shared port, a mixing output port and a local oscillator signal input port, wherein the local oscillator signal input port is electrically connected with the shared port through the first microstrip arm and electrically connected with a second end of one of the mixer tubes through the shared port, wherein the local oscillator signal input port is electrically connected with the mixing output port through the second microstrip arm and electrically connected with a second end of the other mixer tube through the mixing output port, such that when a local oscillator signal is input through the local oscillator signal input port and a feedback signal is input through the shared port, the high frequency feedback signal and local oscillator signal outputting from the shared port and the mixing output port to the mixer tubes are able to be conducted to the ground and the intermediate-frequency signal corresponding to a frequency difference of the local oscillator signal and the feedback signal is able to be extracted.

In one embodiment, the microstrip mixer further includes a grounding bonding pad, wherein the grounding bonding pad is grounded, wherein the grounded ends of the mixer tubes are grounded through being electrically connected with the grounding bonding pad.

In one embodiment, the microstrip mixing line and the grounding bonding pad are loaded on a circuit board, wherein the grounding bonding pad is grounded through a plated hole extended from the grounding bonding pad and passing through the circuit board.

In one embodiment, the microstrip mixer further comprises a feedback signal input arm and a local oscillator signal input arm, wherein the feedback signal input arm is integrally extended from the shared port on the microstrip mixing line, wherein the local oscillator signal input arm is integrally extended from the local oscillator signal input port on the microstrip mixing line.

In one embodiment, as the arm length parameter of the first microstrip arm is $L1$ and the arm length parameter of the second microstrip arm is $L2$, the first microstrip arm and the second microstrip arm are disposed to satisfy that, $\lambda/16 \leq L1 \leq \lambda/2$ and $\lambda/16 \leq L2 \leq \lambda/2$, wherein $\lambda$ is the wavelength parameter corresponding to the local oscillator signal frequency.

In one embodiment, the first microstrip arm and the second microstrip arm are configured to satisfy that $0.8 \cdot L2 \leq L1 \leq 1.2 \cdot L2$ or $0.8 \cdot L1 \leq L2 \leq 1.2 \cdot L1$.

In one embodiment, the first microstrip arm and the second microstrip arm are configured to satisfy that $\lambda/8 \leq L1 \leq \lambda/4$ and $\lambda/8 \leq L2 \leq \lambda/4$.

In one embodiment, the first microstrip arm and the second microstrip arm are configured to satisfy that $L1=L2$.

In one embodiment, as the impedance parameter of the first microstrip arm is Z1 and the impedance parameter of the second microstrip arm is Z2, the first microstrip arm and the second microstrip arm are configured to satisfy that $Z2=k \cdot Z1$, while $k=\lambda/L1$.

In one embodiment, the first microstrip arm and the second microstrip arm are configured to satisfy that $Z2=k \cdot Z1$, wherein k satisfies that $2 \leq k \leq 4$.

In one embodiment, a section of the second microstrip arm is configured to be in a bent square serrated shape.

According to another aspect of the present invention, the present invention also provides a microwave-doppler detecting module, which includes:

a microstrip mixer, comprising two mixer tubes and a microstrip mixing line, a first end of each of the mixer tubes being grounded, the microstrip mixing line comprising a first microstrip arm and a second microstrip arm integrally extended from the first microstrip arm, the microstrip mixer further having a shared port, a mixing output port and a local oscillator signal input port, the local oscillator signal input port being electrically connected with the shared port through the first microstrip arm and electrically connected with a second end of one of the mixer tubes through the shared port, the local oscillator signal input port being electrically connected with the mixing output port through the second microstrip arm and electrically connected with a second end of the other mixer tube through the mixing output port, such that when a local oscillator signal is input through the local oscillator signal input port and a feedback signal is input through the shared port, the high frequency feedback signal and local oscillator signal outputting from the shared port and the mixing output port to the mixer tubes are able to be conducted to the ground and the intermediate-frequency signal corresponding to the frequency difference of the local oscillator signal and the feedback signal is able to be extracted;

an oscillation circuit module, disposed to be adapted to output a local oscillator signal when powered and electrically coupled with the local oscillator signal input port of the microstrip mixer;

a radiation source, electrically coupled with the shared port of the microstrip mixer; and a reference ground, grounded and spacingly arranged with the radiation source.

In one embodiment, as the arm length parameter of the first microstrip arm is L1 and the arm length parameter of the second microstrip arm is L2, the first microstrip arm and the second microstrip arm are disposed to satisfy that, $\lambda/16 \leq L1 \leq \lambda/2$ and $\lambda/16 \leq L2 \leq \lambda/2$, wherein $\lambda$ is the wavelength parameter corresponding to the local oscillator signal frequency.

In one embodiment, the first microstrip arm and the second microstrip arm are configured to satisfy that $0.8 \cdot L2 \leq L1 \leq 1.2 \cdot L2$ or $0.8 \cdot L1 \leq L2 \leq 1.2 \cdot L1$.

In one embodiment, the first microstrip arm and the second microstrip arm are configured to satisfy that $\lambda/8 \leq L1 \leq \lambda/4$ and $\lambda/8 \leq L2 \leq \lambda/4$.

In one embodiment, the first microstrip arm and the second microstrip arm are configured to satisfy that $L1=L2$.

In one embodiment, as the impedance parameter of the first microstrip arm is Z1 and the impedance parameter of the second microstrip arm is Z2, the first microstrip arm and the second microstrip arm are configured to satisfy that $Z2=k \cdot Z1$, while $k=\lambda/L1$.

In one embodiment, the first microstrip arm and the second microstrip arm are configured to satisfy that $Z2=k \cdot Z1$, wherein k satisfies that $2 \leq k \leq 4$.

In one embodiment, the microstrip mixer further includes a grounding bonding pad, wherein the grounding bonding pad is grounded, wherein the grounded ends of the mixer tubes are grounded through being electrically connected with the grounding bonding pad.

In one embodiment, the microwave-doppler detecting module further comprises a circuit board, wherein the microstrip mixing line and the grounding bonding pad are loaded on the circuit board, wherein the grounding bonding pad is grounded through a plated hole extended from the grounding bonding pad and passing through the circuit board.

In one embodiment, the microstrip mixer further comprises a feedback signal input arm and a local oscillator signal input arm, wherein the feedback signal input arm is integrally extended from the shared port on the microstrip mixing line, wherein the local oscillator signal input arm is integrally extended from the local oscillator signal input port on the microstrip mixing line.

In one embodiment, the oscillation circuit module is electrically coupled with the local oscillator signal input port of the microstrip mixer through the local oscillator signal input arm, wherein the radiation source is electrically coupled with the shared port of the microstrip mixer through feedback signal input arm.

In one embodiment, the radiation source is grounded.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Those skilled in the art should understand that, in the disclosure of the present invention, terminologies of "longitudinal," "lateral," "upper," "front," "back," "left," "right," "perpendicular," "horizontal," "top," "bottom," "inner," "outer," and etc. just indicate relations of direction or position are based on the relations of direction or position shown in the appended drawings, which is only to facilitate descriptions of the present invention and to simplify the descriptions, rather than to indicate or imply that the referred device or element must apply specific direction or to be operated or configured in specific direction. Therefore, the above-mentioned terminologies shall not be interpreted as confine to the present invention.

It is understandable that the term "a" should be understood as "at least one" or "one or more". In other words, in one embodiment, the number of an element can be one and in other embodiment the number of the element can be greater than one. The term "a" is not construed as a limitation of quantity.

Figure 1:
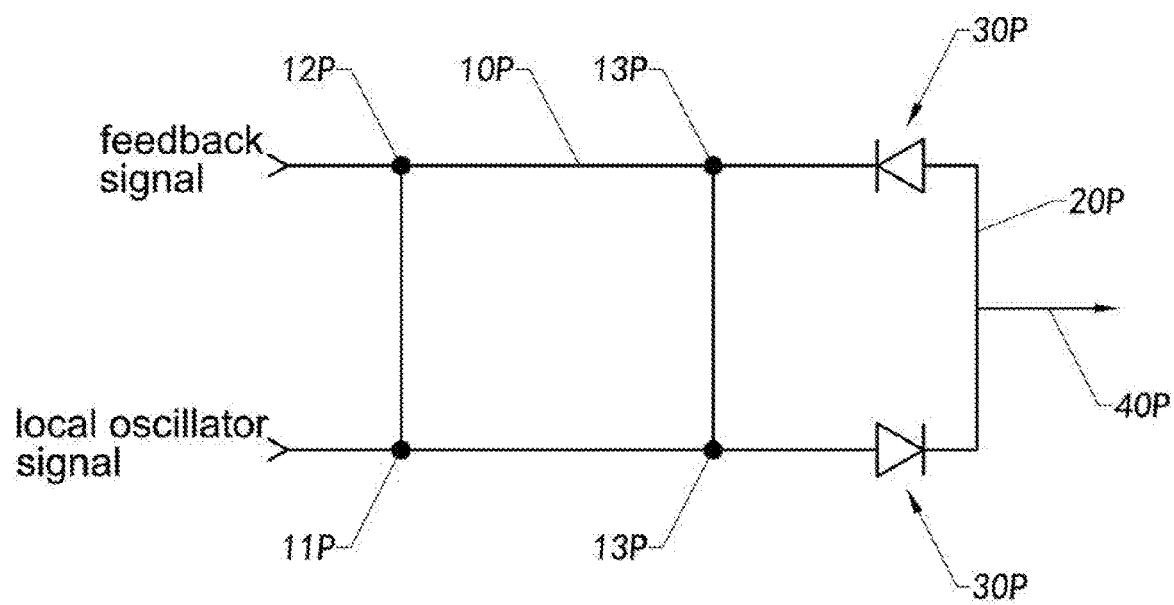
FIG. 1 is a schematic diagram illustrating an equivalent circuitry of a conventional balanced mixer.
Figure 2:
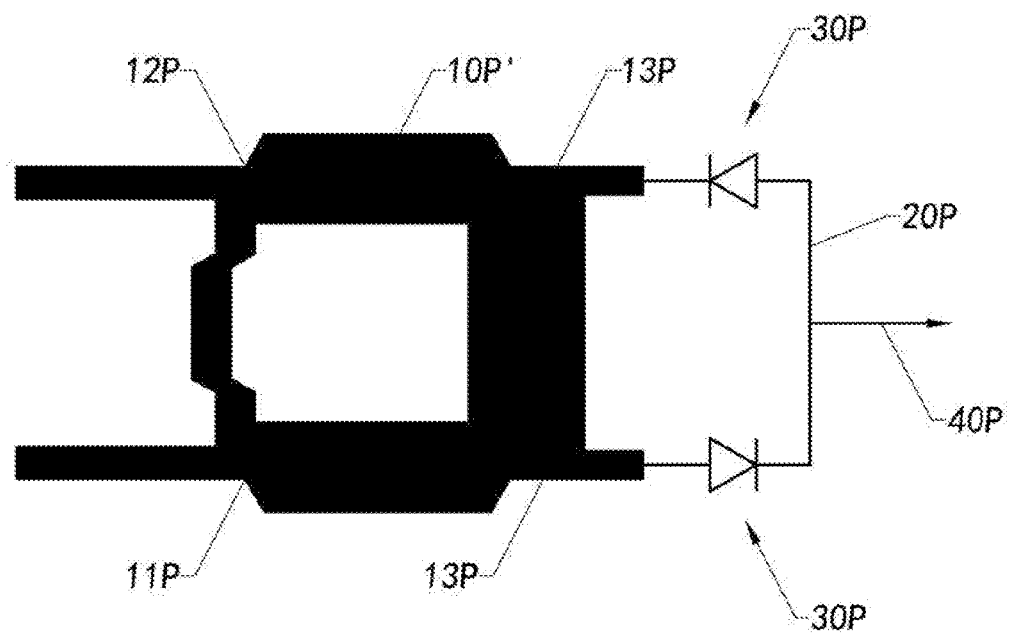
FIG. 2 is a schematic diagram illustrating a conventional microstrip structure of a conventional microstrip balanced mixer utilizing 3 dB electric bridge with two branches based on an equivalent circuitry of a balanced mixer.
Figure 3:
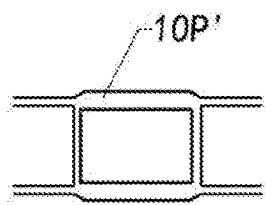
FIG. 3 is a schematic diagram illustrating a conventional microstrip structure of electric bridge with two branches based on an equivalent circuitry of a balanced mixer.
Figure 4:
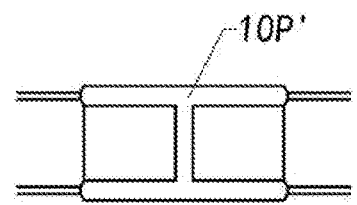
FIG. 4 is a schematic diagram illustrating a conventional microstrip structure of electric bridge of three branches based on an equivalent circuitry of a balanced mixer.
Figure 5:
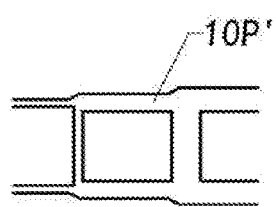
FIG. 5 is a schematic diagram illustrating a conventional microstrip structure of a rheostat electric bridge based on an equivalent circuitry of a balanced mixer.
Figure 6:
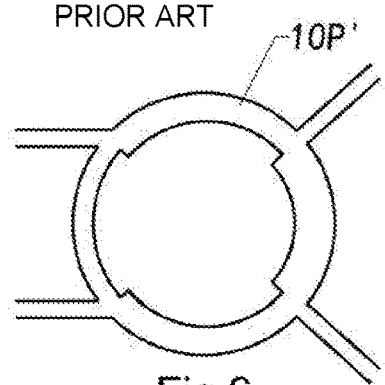
FIG. 6 is a schematic diagram illustrating a conventional microstrip structure of ringlike rheostat electric bridge of two branches based on an equivalent circuitry of a balanced mixer.
Figure 7:
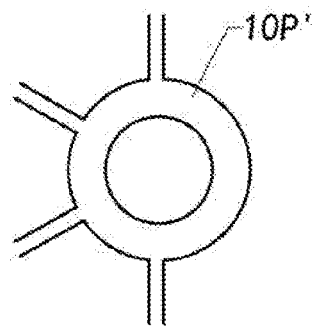
FIG. 7 is a schematic diagram illustrating a conventional microstrip structure of a ringlike electric bridge based on an equivalent circuitry of a balanced mixer.
Figure 8:
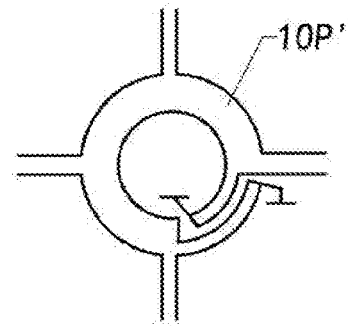
FIG. 8 is a schematic diagram illustrating a conventional microstrip structure of a broadband ringlike electric bridge based on an equivalent circuitry of a balanced mixer.
Figure 9:
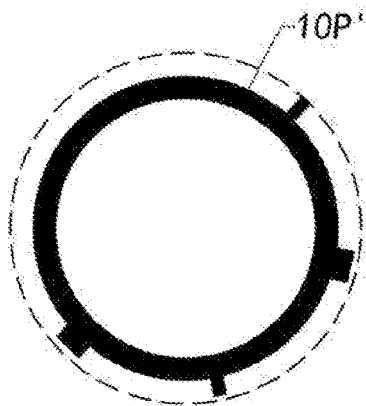
FIG. 9 is a schematic diagram illustrating a conventional microstrip structure of a general microstrip balanced mixer based on an equivalent circuitry of a balanced mixer.
Figure 10:
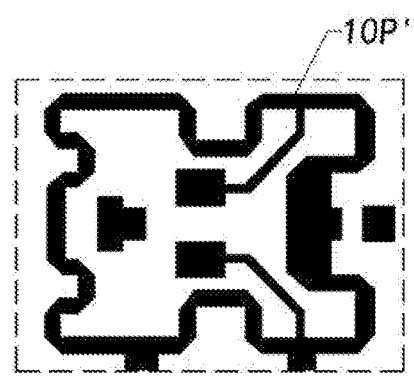
FIG. 10 is a schematic diagram illustrating a conventional microstrip structure of another general microstrip balanced mixer based on an equivalent circuitry of a balanced mixer.
Figure 11:
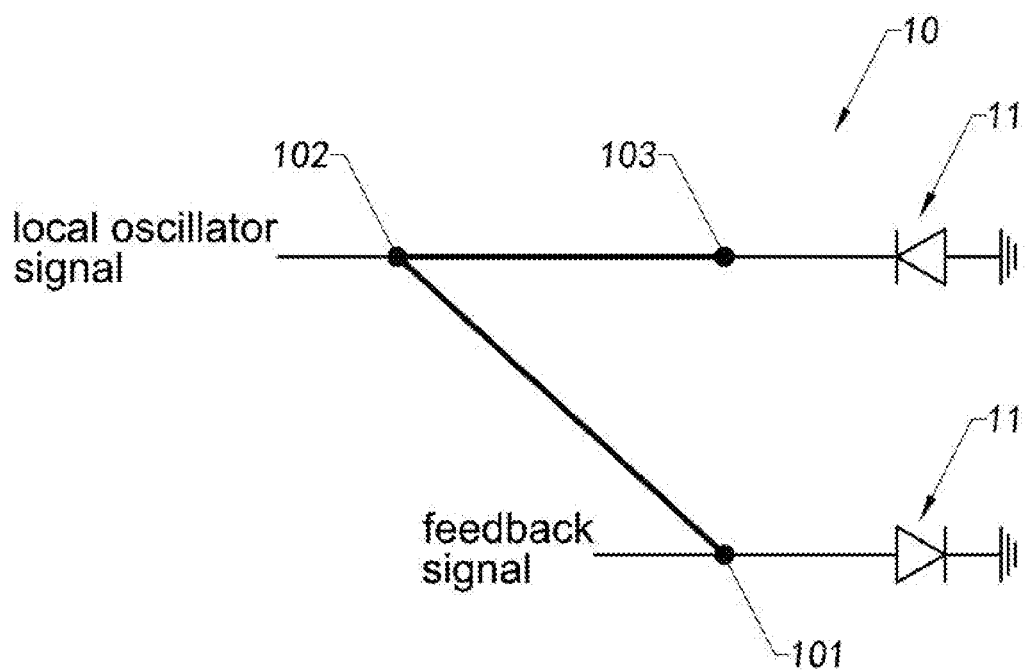
FIG. 11 is a schematic diagram of an equivalent circuitry of a microstrip mixer according to a preferred embodiment of the present invention.

Referring to FIG. 11, an equivalent circuitry of a microstrip mixer 10 according to a preferred embodiment of the present invention is illustrated, wherein the microstrip mixer 10 utilizes an open structure having three ports to make the design of the microstrip structure of the microstrip mixer 10 being more simple and flexible that facilitates a decrease of the size of the microstrip mixer 10 and lowers a limitation of the port positions of the microstrip mixer 10, such that the microstrip mixer 10 not only has a flexible microstrip structure design, but also is capable of being designed in being adapted to corresponding circuit structures, which enhances the applicability of the microstrip mixer 10.

In particular, the microstrip mixer 10 has a shared port 101, a local oscillator signal input port 102 and a mixing output port 103, and comprises two mixer tubes 11, wherein the shared port 101 is electrically connected with the local oscillator signal input port 102 and a first end of one of the mixer tubes 11. In other words, the local oscillator signal input port 102 is electrically connected with the shared port 101 and the first end of the one of the mixer tubes 11 through the shared port 101, wherein the local oscillator signal input port 102 is also electrically connected with the mixing output port 103 and a first end of the other mixer tube 11 through the mixing output port 103, while second ends of the two mixer tubes 11 are grounded, so as to form and construct the microstrip mixer 10 that has an open structure with three ports.

Further, the shared port 101 is configured for feedback signal input and mixing output, the local oscillator signal input port 102 is configured for local oscillator signal input, and the mixing output port 103 is configured for mixing output, such that when the local oscillator signal input port 102 inputs a local oscillator signal to the microstrip mixer 10, the shared port 101 can output the local oscillator signal based on its electrical connection with the local oscillator signal input port 102. That is the shared port 101 is configured to be able to output local oscillator signal and input feedback signal, so that the microstrip mixer 10 is adapted for the mixing output of the microwave-doppler detecting module with integral structure for receiving and dispatching.

It is worth mentioning that the first ends of the two mixer tubes 11 are respectively electrically connected with the shared port 101 and the mixing output port 103 and the second ends of the two mixer tubes 11 are grounded, such that the high frequency local oscillator signal and feedback signal respectively outputted from the shared port 101 and the mixing output port 103 to the two mixer tubes 11 correspondingly can be conducted to the ground, which lowers the interference to the intermediate-frequency signal output by the microstrip mixer 10 and increases the sensitivity of the microstrip mixer 10.

It is understandable that, since the high frequency local oscillator signal and feedback signal respectively outputted from the shared port 101 and the mixing output port 103 to the corresponding mixer tubes 11 can be conducted to the ground, the intermediate-frequency signal corresponding to the local oscillator signal and the feedback signal can be extracted among any of the ports 101, 102, 103 of the microstrip mixer 10 and the two mixer tubes 11, while it is preferably extracted from the positions close to the shared port 101 or the mixing output port 103 of the microstrip mixer 10, wherein the present invention shall not be limited here.

In particular, according to the preferred embodiment of the present invention, the microstrip mixer 10 satisfies that the local oscillator signals inputted from the local oscillator signal input port 102 have a phase difference of 180 degrees between the mixing output port 103 and the shared port 101, and the feedback signals inputted from the shared port 101 have a phase difference of 180 degrees between the mixing output port 103 and the shared port 101. In other words, there is a phase difference of 180 degrees between the mixing output port 103 and the shared port 101, so as to allow the microstrip mixer 10 to output an intermediate-frequency signal corresponding to the frequency difference between the local oscillator signal and the feedback signal in a maximum amplitude, which is thereby beneficial for enhancing the sensitivity of the microwave-doppler detecting module.

Specifically, the local oscillator signal input port 102 is electrically connected with the shared port 101 and the mixing output port 103, wherein the phase difference between the local oscillator signal input port 102 and the shared port is 90 degrees and the phase difference between the local oscillator signal input port 102 and the mixing output port 103 is also 90 degrees, such that it allows the two mixer tubes 11 to be respectively arranged at the mixing output port 103 and the shared port 101 in opposite direction (e.g. when the positive electrode of one of the mixer tubes 11 is connected with the mixing output port 103, the negative electrode of the other mixer tube 11 is connected with the shared port 101), so as to create a phase difference of 180 degrees between the mixing output port 103 and the shared port 101.

It is worth mentioning that there is a phase difference of 180 degrees between the mixing output port 103 and the shared port 101, such that there will be an electrical length of almost 180 degree between the shared port 101 and the mixing output port 103 from the shared port 101 through the local oscillator signal input port 102 to the mixing output port 103. Accordingly, an actual circuit between the shared port 101 and the mixing output port 103 from the shared port 101 through the local oscillator signal input port 102 to the mixing output port 103 can be arranged to be within a length range less than a wavelength to achieve the phase difference of 180 degrees between the mixing output port 103 and the shared port 101, wherein the wavelength is corresponding to the wavelength of the local oscillator signal frequency. Accordingly, the microstrip mixer 10 with the open structure having three ports is able to not only have the microstrip structure design flexible, but also allow the length of the corresponding microstrip line be arranged with the length range less than a wavelength and achieve the phase difference of 180 degrees between the mixing output port 103 and the shared port 101. In other words, the length of the corresponding microstrip line of the microstrip mixer 10, in contrast to it of a balanced mixer, has become shorter, which, combining with the flexible microstrip structure design of the microstrip mixer 10, helps the size of the microstrip mixer 10 be further reduced.

Figure 12:
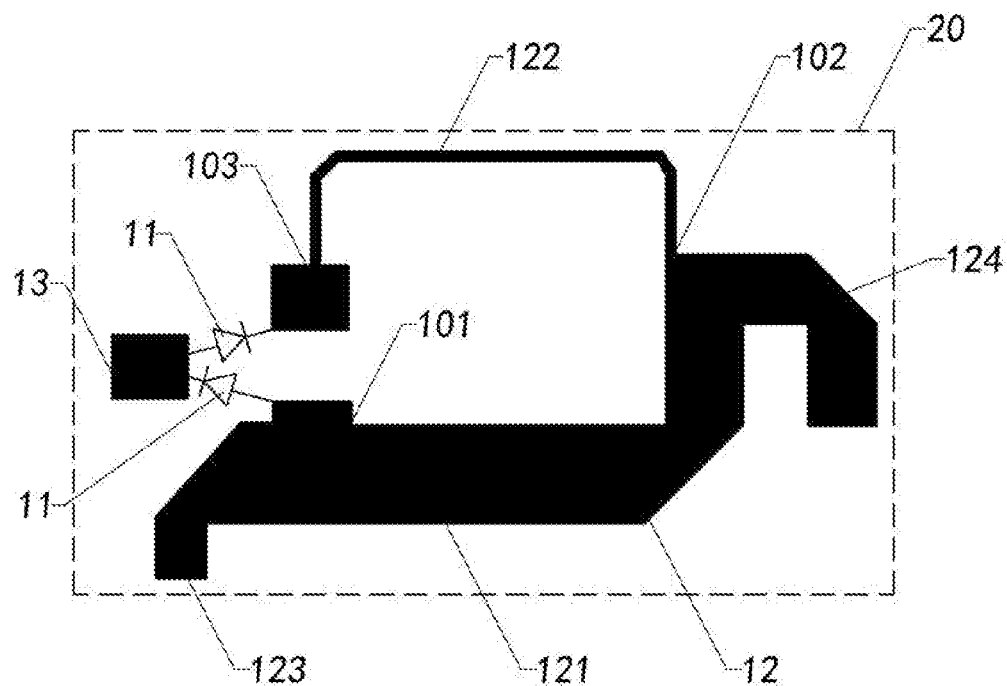
FIG. 12 is a schematic diagram illustrating a microstrip structure of the microstrip mixer based on the equivalent circuitry of the above preferred embodiment of the present invention.
Figure 13:
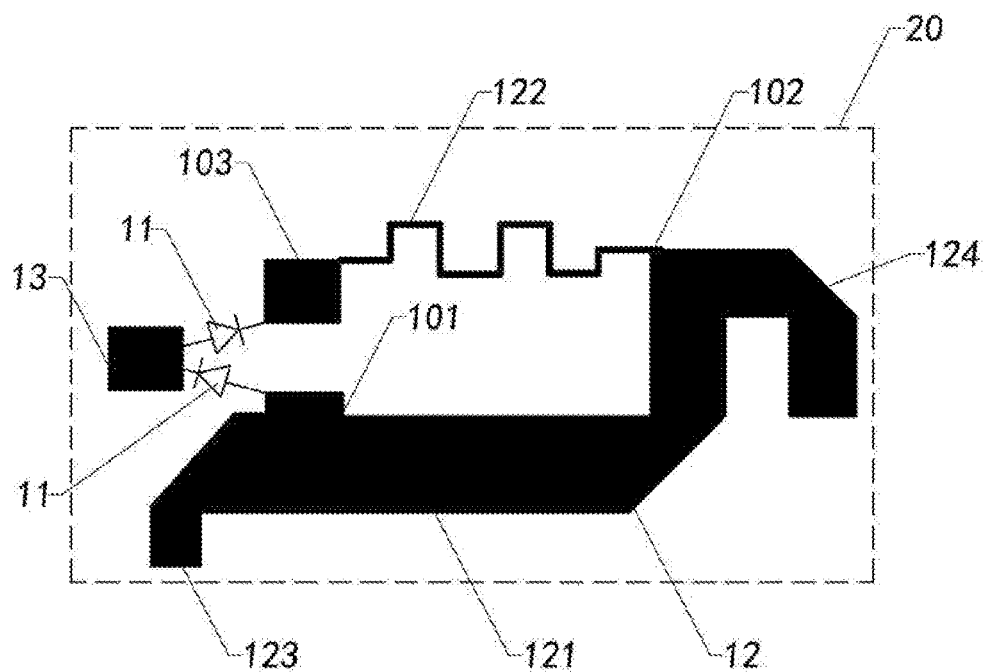
FIG. 13 is a schematic diagram illustrating another microstrip structure of the microstrip mixer based on the equivalent circuitry of the above preferred embodiment of the present invention.

Further, referring to FIGS. 12-13, two microstrip structures for the microstrip mixer 10 based on the equivalent circuitry illustrated in FIG. 11 are respectively illustrated. The microstrip mixer 10 comprises a microstrip mixing line 12 and a grounding bonding pad 13 loaded on a circuit board 20, wherein the shared port 101, the local oscillator signal input port 102 and the mixing output port 103 are formed on the microstrip mixing line 12. Besides, the local oscillator signal input port 102 is formed between the shared port 101 and the mixing output port 103 on the microstrip mixing line 12. The microstrip mixing line 12 comprises a first microstrip arm 121 formed between the shared port 101 and the local oscillator signal input port 102 and a second microstrip arm 122 formed between the local oscillator signal input port 102 and the mixing output port 103 as well as extended from the first microstrip arm 121. One of the mixer tubes 11 is electrically connected between the shared port 101 and the grounding bonding pad 13, while the other mixer tube 11 is electrically connected between the mixing output port 103 and the grounding bonding pad 13. The grounding bonding pad 13 is grounded.

Accordingly, a circuit connection condition is created that the local oscillator signal input port 102 is electrically connected with the shared port 101 by the first microstrip arm 121 and electrically connected with the first end of one of the mixer tubes 11 through the shared port 101, that the local oscillator signal input port 102 is electrically connected with the mixing output port 103 by the second microstrip arm 122 and electrically connected with the first end of the other mixer tube 11 through the mixing output port 103, and that the other ends of the two mixer tubes 11 are connected with the grounded circuit on the grounding bonding pad 13, so as to form the microstrip mixer 10 with the open structure having three ports.

Specifically, in order to provide a phase difference of 90 degrees between the shared port 101 and the local oscillator signal input port 102 on the first microstrip arm 121 and provide a phase difference of 90 degrees between the local oscillator signal input port 102 and the mixing output port 103 on the second microstrip arm 122, the arm length parameters L1 and L2 of the first microstrip arm 121 and the second microstrip arm 122 of the microstrip mixing line 12 are configured to satisfy that $\lambda/16 \leq L1 = L2 \leq \lambda/2$, wherein $\lambda$ is corresponding to the wavelength parameter of the local oscillator signal frequency, so as to facilitate the forming of a phase difference of 90 degrees between the local oscillator signal input port 102 and the shared port 101 and a phase difference of 90 degrees between the local oscillator signal input port 102 and the mixing output port 103. Hence, a phase difference of 180 degrees can be formed between the mixing output port 103 and the shared port 101 through having the two mixer tubes 11 respectively disposed and arranged the mixing output port 103 and the shared port in an opposite manner (e.g. if the negative electrode of one of the mixer tubes 11 is connected with the mixing output port 103, the positive electrode of the other mixer tube 11 will be connected with the shared port 101), so as to allow the microstrip mixer 10 to output an intermediate-frequency signal corresponding to the frequency difference between the local oscillator signal and the feedback signal in a maximum amplitude, which helps to enhance the sensitivity of the corresponding microwave-doppler detecting module.

It is worth mentioning that, considering the processing errors for the first microstrip arm 121 and the second microstrip arm 122 as well as the shape and thickness parameters of the first microstrip arm 121 and the second microstrip arm 122 that can affect the electrical lengths of the first microstrip arm 121 and the second microstrip arm 122, the equal length relation between the first microstrip arm 121 and the second microstrip arm 122 shall be referred to be equal in length within an error range of 20%. In other words, the arm length parameter of the first microstrip arm 121 satisfies that $\lambda/16 \leq L1 \leq \lambda/2$, the arm length parameter of the second microstrip arm 122 satisfies that $\lambda/16 \leq L2 \leq \lambda/2$, and the arm length parameter L1 of the first microstrip arm 121 and the arm length parameter L2 of the second microstrip arm 122 satisfy that $0.8 \cdot L2 \leq L1 \leq 1.2 \cdot L2$ or $0.8 \cdot L1 \leq L2 \leq 1.2 \cdot L1$.

In particular, the arm length parameters L1 and L2 of the first microstrip arm 121 and the second microstrip arm 122 of the microstrip mixing line 12 based on the relation basis of $\lambda/16 \leq L1 = L2 \leq \lambda/2$ are preferably configured to satisfy that $\lambda/8 \leq L1 = L2 \leq \lambda/4$. Similarly, the equal length relation between the first microstrip arm 121 and the second microstrip arm 122 shall be referred to be equal in length within an error range of 20%. In other words, the arm length parameters L1 and L2 of the first microstrip arm 121 and the second microstrip arm 122 of the microstrip mixing line 12 are preferably configured to satisfy that $\lambda/8 \leq L1 \leq \lambda/4$ and $\lambda/8 \leq L2 \leq \lambda/4$ and the arm length parameter L1 of the first microstrip arm 121 and the arm length parameter L2 of the second microstrip arm 122 satisfy that $0.8 \cdot L2 \leq L1 \leq 1.2 \cdot L2$ or $0.8 \cdot L1 \leq L2 \leq 1.2 \cdot L1$.

It is understandable that based on the structure and connection relations of the microstrip mixing line 12 and the two mixer tubes 11 and the grounding bonding pad 13, the microstrip mixer 10 has the open structure having three ports and is able to form a phase difference of 180 degrees between the mixing output port 103 and the shared port 101, wherein the shape of the first microstrip arm 121 and the second microstrip arm 122 of the microstrip mixing line 12 is flexible. That is to say, the microstrip mixer 10 has a flexible microstrip structural design capable of being designed to be adapted for corresponding circuit. This enhances the applicability of the microstrip mixer 10 and is beneficial for reducing the size of the microstrip mixer 10. For example, referring to FIG. 13, a section of the second microstrip arm 122 is designed to be in a waved square serrated shape, which helps to reduce the size of the microstrip mixer 10.

It is worth mentioning that, based on the relation between the arm length parameters $L1$ and $L2$ of the first microstrip arm 121 and the second microstrip arm 122 of the microstrip mixing line 12 that satisfies that $\lambda/16 \leq L1 = L2 \leq \lambda/2$, the microstrip mixing line 12 can be arranged to have a length range less than $\lambda$ to achieve the phase difference of 180 degrees between the mixing output port 103 and the shared port 101. Accordingly, the microstrip mixer 10 with the open structure having three ports is able to not only have the microstrip structure design flexible, but also allow the length of the microstrip mixing line 10 be arranged to have the length range less than $\lambda$ and achieve the phase difference of 180 degrees between the mixing output port 103 and the shared port 101. In other words, the length of the corresponding microstrip line of the microstrip mixer 10, in contrast to a balanced mixer, has become shorter, which, combining with the flexible microstrip structure design of the microstrip mixer 10, helps the size of the microstrip mixer 10 be further reduced.

Further, according to the preferred embodiment of the present invention, the impedance parameters $Z1$ and $Z2$ of the first microstrip arm 121 and the second microstrip arm 122 are configured to satisfy that $Z2 = k \cdot Z1$, $k = \lambda/L1$, and preferably $2 \leq k \leq 4$, such that the first microstrip arm 121 and the second microstrip arm 122 also satisfy that $\lambda/16 \leq L1 = L2 \leq \lambda/2$ as a basis and $Z2 = k \cdot Z1$, and that it utilizes the impedance relations between the first microstrip arm 121 and the second microstrip arm 122 that satisfies that $Z2 = k \cdot Z1$ to reasonably distribute the oscillation voltage power, which facilitates the impedance matching of the microwave-doppler detecting module.

In particular, according to the preferred embodiment of the present invention, the grounding bonding pad 13 is grounded through a plated hole (e.g. a plated blind hole, a plated through hole, and etc.) that is extended from the grounding bonding pad 13 and passes through the circuit board 20. This facilitates to simplify the microstrip structure of the microstrip mixer 10 and further reduce the size of the microstrip mixer 10 as well as helps to increase the uniformity of the microstrip structure of the microstrip mixer 10.

Further, according to the preferred embodiment of the present invention, the microstrip mixing line 12 comprises a feedback signal input arm 123 integrally extended from the shared port 101 and a local oscillator signal input arm 124 integrally extended from the local oscillator signal input port 102. It utilizes the structure and design of the local oscillator signal input arm 124 and the feedback signal input arm 123 to allow the microstrip mixer 10 to be adapted by various circuit structures on the circuit board 20, which further enhances the applicability of the microstrip mixer 10.

Figure 14:
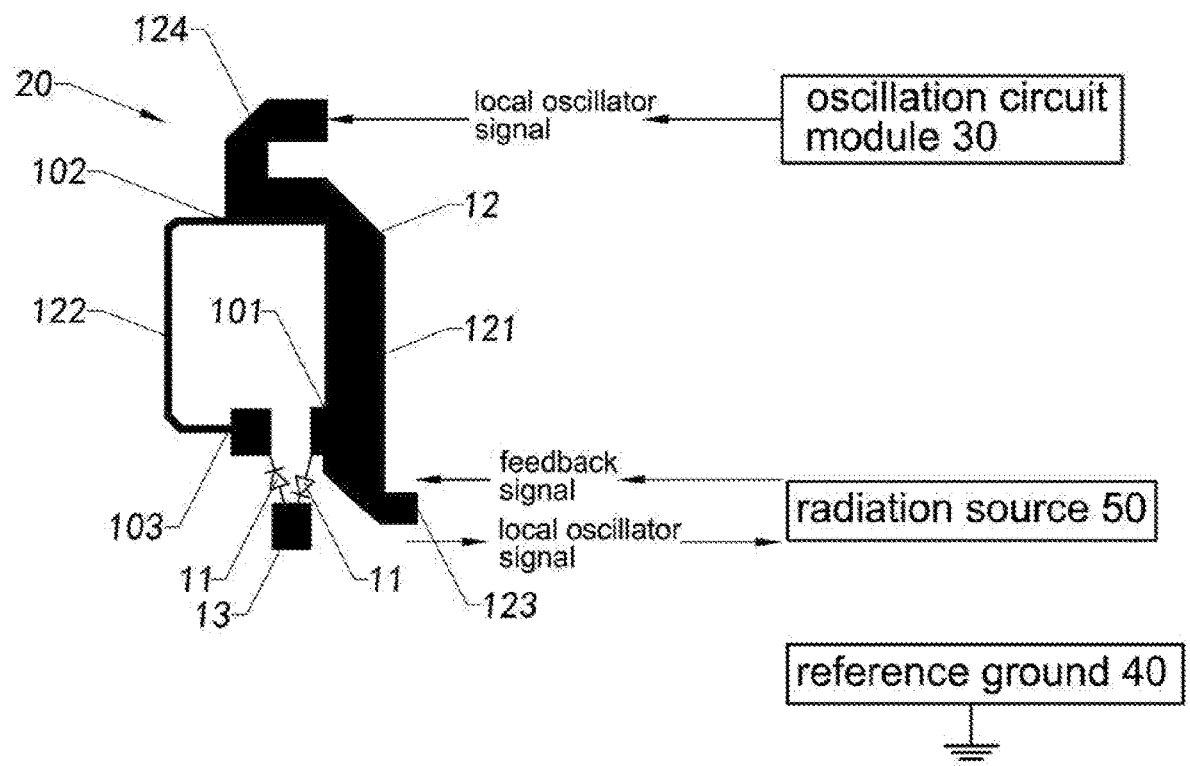
FIG. 14 is a block diagram illustrating the circuit structure of a microwave-doppler detecting module comprising the microstrip mixer according to the above preferred embodiment of the present invention.

Referring to FIG. 14, a block diagram illustrating a circuit structure of a microwave-doppler detecting module that has the microstrip mixer 10 according to the above preferred embodiment is shown. The microwave-doppler detecting module includes an oscillation circuit module 30, a reference ground 40 and a radiation source 50, wherein the oscillation circuit module 30 is configured to be able to output local oscillator signal when powered, wherein the oscillation circuit module 30 is electrically coupled with the local oscillator signal input port 102 of the microstrip mixer 10 through the local oscillator signal input arm 124, wherein the radiation source 50 is electrically coupled with the shared port 101 of the microstrip mixer 10 through the feedback signal input arm 123, wherein the reference ground 40 is grounded and spacingly arranged with the radiation source 50. Accordingly, the oscillation circuit module 30 can be electrically coupled with the radiation source 50 and feeds the radiation source 50 through the local oscillator signal input arm 124, the first microstrip arm 121 and the feedback signal input arm 123 when powered. Also, a local oscillator signal can be inputted to the microstrip mixer 10 from the local oscillator signal input port 102 and through the local oscillator signal input arm 124. Therefore, the radiation source 50 can be fed and emits a sounding wave beam corresponding to the local oscillator signal frequency corresponding to the reference ground 40. The sounding wave beam can be reflected to form a corresponding echo to be received by the radiation source 50 to form a feedback signal. The feedback signal can then be inputted to the microstrip mixer 10 from the shared port 101 through the feedback signal input arm 123, so as to allow the microstrip mixer 10 to input an intermediate-frequency signal corresponding to the frequency difference between the local oscillator signal and the feedback signal. Based on Doppler effect, the intermediate-frequency signal is corresponding to the movement of the corresponding object that reflects the sounding wave beam and forms the corresponding echo.

It is understandable that, based on the open structure design of the three ports of the microstrip mixer 10, the size of the microstrip mixer 10 can therefore be reduced based on the flexible microstrip structure design thereof, such that the size of the circuit board 20 that loads the microstrip mixer 10 can be reduced as well, which helps to reduce the size of the microwave-doppler detecting module that utilizes the microstrip mixer 10.

It is worth mentioning that according to some embodiments of the present invention, the radiation source 50 is grounded so as to lower the impedance of the microwave-doppler detecting module and correspondingly enhance the quality factor (Q value) of the microwave-doppler detecting module. Therefore, the bandwidth of the microwave-doppler detecting module will be reduced, which helps to enhance the anti-interference ability of the microwave-doppler detecting module. Nonetheless, as the impedance of the microwave-doppler detecting module is lowered, the amplitude value of the corresponding initial intermediate-frequency signal will also be lowered, which is disadvantageous for the analysis processing of the intermediate-frequency signal. When the intermediate-frequency signal with a lower amplitude value has to be amplified and filtered, it may render signal distortion easily. Hence, when the microwave-doppler detecting module utilizes the microstrip mixer 10, because the microstrip mixer 10 satisfies that there is a phase difference of 180 degrees between the mixing output port 103 and the shared port 101, the microstrip mixer 10 is allowed to output the initial intermediate-frequency signal, corresponding to the frequency difference between the local oscillator signal and the feedback signal in a maximum amplitude. This helps to enhance the sensitivity of the microwave-doppler detecting module and, when the radiation source 50 is grounded, enhance the anti-interference ability of the microwave-doppler detecting module while the sensitivity of the microwave-doppler detecting module is ensured at the same time.

One skilled in the art will understand that the embodiment of the present invention as shown in the drawings and described above is exemplary only and not intended to be limiting. It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A microstrip mixer, adapted for receiving a local oscillator signal and a feedback signal and outputting an intermediate-frequency signal corresponding to a frequency difference between the local oscillator signal and the feedback signal, comprising:
at least first and second mixer tubes each having a first end being grounded; and
a microstrip mixing line, comprising a first microstrip arm and a second microstrip arm integrally extended from said first microstrip arm, and having a shared port, a mixing output port and a local oscillator signal input port, said local oscillator signal input port being electrically connected with said shared port through said first microstrip arm and electrically connected with a second end of said first mixer tube through said shared port, said local oscillator signal input port being electrically connected with said mixing output port through said second microstrip arm and electrically connected with a second end of said second mixer tube through said mixing output port, such that when a local oscillator signal is inputted through said local oscillator signal input port and a feedback signal is inputted through said shared port, the high frequency feedback signal and the local oscillator signal outputted from said shared port and said mixing output port to said first and second mixer tubes are able to be conducted to the ground and the intermediate-frequency signal corresponding to the frequency difference of the local oscillator signal and the feedback signal is able to be extracted.

2. The microstrip mixer, as recited in claim 1, further comprising a grounding bonding pad, wherein said grounding bonding pad is grounded, wherein said first ends of said first and second mixer tubes are grounded through being electrically connected with said grounding bonding pad.

3. The microstrip mixer, as recited in claim 2, wherein said microstrip mixing line and said grounding bonding pad are loaded on a circuit board, wherein said grounding bonding pad is grounded through a plated hole extended from said grounding bonding pad and passing through said circuit board.

4. The microstrip mixer, as recited in claim 3, further comprising a feedback signal input arm and a local oscillator signal input arm, wherein said feedback signal input arm is integrally extended from said shared port on said microstrip mixing line, wherein said local oscillator signal input arm is integrally extended from said local oscillator signal input port on said microstrip mixing line.

5. The microstrip mixer, as recited in claim 1, wherein as an arm length parameter of said first microstrip arm is L1 and an arm length parameter of said second microstrip arm is L2, said first microstrip arm and said second microstrip arm are arranged to satisfy that $\lambda/16 \leq L1 \leq \lambda/2$ and $\lambda/16 \leq L2 \leq \lambda/2$, wherein $\lambda$ is the wavelength parameter corresponding to the local oscillator signal frequency.

6. The microstrip mixer, as recited in claim 2, wherein as an arm length parameter of said first microstrip arm is L1 and an arm length parameter of said second microstrip arm is L2, said first microstrip arm and said second microstrip arm are arranged to satisfy that $\lambda/16 \leq L1 \leq \lambda/2$ and $\lambda/16 \leq L2 \leq \lambda/2$, wherein $\lambda$ is the wavelength parameter corresponding to the local oscillator signal frequency.

7. The microstrip mixer, as recited in claim 3, wherein as an arm length parameter of said first microstrip arm is L1 and an arm length parameter of said second microstrip arm is L2, said first microstrip arm and said second microstrip arm are arranged to satisfy that $\lambda/16 \leq L1 \leq \lambda/2$ and $\lambda/16 \leq L2 \leq \lambda/2$, wherein $\lambda$ is the wavelength parameter corresponding to the local oscillator signal frequency.

8. The microstrip mixer, as recited in claim 4, wherein as an arm length parameter of said first microstrip arm is L1 and an arm length parameter of said second microstrip arm is L2, said first microstrip arm and said second microstrip arm are arranged to satisfy that $\lambda/16 \leq L1 \leq \lambda/2$ and $\lambda/16 \leq L2 \leq \lambda/2$, wherein $\lambda$ is the wavelength parameter corresponding to the local oscillator signal frequency.

9. The microstrip mixer, as recited in claim 5, wherein said first microstrip arm and said second microstrip arm are configured to satisfy one of that, $0.8 \cdot L2 \leq L1 \leq 1.2 \cdot L2$ and $0.8 \cdot L1 \leq L2 \leq 1.2 \cdot L1$.

10. The microstrip mixer, as recited in claim 9, wherein said first microstrip arm and said second microstrip arm are configured to satisfy that $\lambda/8 \leq L1 \leq \lambda/4$ and $\lambda/8 \leq L2 \leq \lambda/4$.

11. The microstrip mixer, as recited in claim 10, wherein said first microstrip arm and said second microstrip arm are configured to satisfy that L1=L2.

12. The microstrip mixer, as recited in claim 9, wherein as an impedance parameter of said first microstrip arm is Z1 and an impedance parameter of said second microstrip arm is Z2, said first microstrip arm and said second microstrip arm are configured to satisfy that $Z2 = k \cdot Z1$, while $k = \lambda/L1$.

13. The microstrip mixer, as recited in claim 12, wherein said first microstrip arm and said second microstrip arm are configured to satisfy that $Z2 = k \cdot Z1$, wherein k satisfies that $2 \leq k \leq 4$.

14. The microstrip mixer, as recited in claim 9, wherein a section of said second microstrip arm is configured to be in a bent square serrated shape.

15. A microwave-doppler detecting module, comprising:
a microstrip mixer, comprising at least first and second mixer tubes and a microstrip mixing line, first ends of said first and second mixer tubes being grounded, wherein said microstrip mixing line comprises a first microstrip arm and a second microstrip arm integrally extended from said first microstrip arm, wherein said microstrip mixer has a shared port, a mixing output port and a local oscillator signal input port, wherein said local oscillator signal input port is electrically connected with said shared port through said first microstrip arm and electrically connected with a second end of said first said mixer tube through said shared port, wherein said local oscillator signal input port is electrically connected with said mixing output port through said second microstrip arm and electrically connected with a second end of said second mixer tube through said mixing output port, such that when a local oscillator signal is input through said local oscillator signal input port and a feedback signal is input through said shared port, the high frequency feedback signal and local oscillator signal output from said shared port and said mixing output port to said mixer tubes are able to be conducted to the ground and the intermediate-frequency signal corresponding to the frequency difference of the local oscillator signal and the feedback signal is able to be extracted;

an oscillation circuit module, arranged to be adapted to output a local oscillator signal when powered and electrically coupled with said local oscillator signal input port of said microstrip mixer;

a radiation source, electrically coupled with said shared port of said microstrip mixer; and a reference ground, grounded and spacingly arranged with said radiation source.

16. The microwave-doppler detecting module, as recited in claim 15, wherein as an arm length parameter of said first microstrip arm is L1 and an arm length parameter of said second microstrip arm is L2, said first microstrip arm and said second microstrip arm are disposed to satisfy that $\lambda/16 \le L1 \le \lambda/2$ and $\lambda/16 \le L2 \le \lambda/2$, wherein $\lambda$ is the wavelength parameter corresponding to the local oscillator signal frequency.

17. The microwave-doppler detecting module, as recited in claim 16, wherein said first microstrip arm and said second microstrip arm are configured to satisfy one of that, $0.8 \cdot L2 \le L1 \le 1.2 \cdot L2$ and $0.8 \cdot L1 \le L2 \le 1.2 \cdot L1$.

18. The microwave-doppler detecting module, as recited in claim 17, wherein said first microstrip arm and said second microstrip arm are configured to satisfy that $\lambda/8 \le L1 \le \lambda/4$ and $\lambda/8 \le L2 \le \lambda/4$.

19. The microwave-doppler detecting module, as recited in claim 18, wherein said first microstrip arm and said second microstrip arm are configured to satisfy that $L1=L2$.

20. The microwave-doppler detecting module, as recited in claim 17, wherein as an impedance parameter of said first microstrip arm is Z1 and an impedance parameter of said second microstrip arm is Z2, said first microstrip arm and said second microstrip arm are configured to satisfy that $Z2=k \cdot Z1$, while $k=\lambda/L1$.

21. The microwave-doppler detecting module, as recited in claim 20, wherein said first microstrip arm and said second microstrip arm are configured to satisfy that $Z2=k \cdot Z1$, wherein k satisfies that $2 \le k \le 4$.

22. The microwave-doppler detecting module, as recited in claim 15, wherein said microstrip mixer further comprises a grounding bonding pad, wherein said grounding bonding pad is grounded, wherein the grounded ends of said mixer tubes are grounded through being electrically connected with said grounding bonding pad.

23. The microwave-doppler detecting module, as recited in claim 16, wherein said microstrip mixer further comprises a grounding bonding pad, wherein said grounding bonding pad is grounded, wherein said first ends of said first and second mixer tubes are grounded through being electrically connected with said grounding bonding pad.

24. The microwave-doppler detecting module, as recited in claim 17, wherein said microstrip mixer further comprises a grounding bonding pad, wherein said grounding bonding pad is grounded, wherein said first ends of said first and second mixer tubes are grounded through being electrically connected with said grounding bonding pad.

25. The microwave-doppler detecting module, as recited in claim 18, wherein said microstrip mixer further comprises a grounding bonding pad, wherein said grounding bonding pad is grounded, wherein said first ends of said first and second mixer tubes are grounded through being electrically connected with said grounding bonding pad.

26. The microwave-doppler detecting module, as recited in claim 19, wherein said microstrip mixer further comprises a grounding bonding pad, wherein said grounding bonding pad is grounded, wherein said first ends of said first and second mixer tubes are grounded through being electrically connected with said grounding bonding pad.

27. The microwave-doppler detecting module, as recited in claim 20, wherein said microstrip mixer further comprises a grounding bonding pad, wherein said grounding bonding pad is grounded, wherein said first ends of said first and second mixer tubes are grounded through being electrically connected with said grounding bonding pad.

28. The microwave-doppler detecting module, as recited in claim 21, wherein said microstrip mixer further comprises a grounding bonding pad, wherein said grounding bonding pad is grounded, wherein said first ends of said first and second mixer tubes are grounded through being electrically connected with said grounding bonding pad.

29. The microwave-doppler detecting module, as recited in claim 22, further comprising a circuit board, wherein said microstrip mixing line and said grounding bonding pad are loaded on said circuit board, wherein said grounding bonding pad is grounded through a plated hole extended from said grounding bonding pad and passing through said circuit board.

30. The microwave-doppler detecting module, as recited in claim 29, wherein said microstrip mixer further comprises a feedback signal input arm and a local oscillator signal input arm, wherein said feedback signal input arm is integrally extended from said shared port on said microstrip mixing line, wherein said local oscillator signal input arm is integrally extended from said local oscillator signal input port on said microstrip mixing line.

31. The microwave-doppler detecting module, as recited in claim 30, wherein said oscillation circuit module is electrically coupled with said local oscillator signal input port of said microstrip mixer through said local oscillator signal input arm, wherein said radiation source is electrically coupled with said shared port of said microstrip mixer through feedback signal input arm.

32. The microwave-doppler detecting module, as recited in claim 31, wherein said radiation source is grounded.

* * * * *